(12) United States Patent
Hou

(10) Patent No.: US 6,792,528 B1
(45) Date of Patent: Sep. 14, 2004

(54) METHOD AND APPARATUS FOR SECURING DATA CONTENTS OF A NON-VOLATILE MEMORY DEVICE

(76) Inventor: Chien-Tzu Hou, 38881 Garibaldi Common, Fremont, CA (US) 94536

( * ) Notice: Subject to any disclaimer, the term of this patent is extended or adjusted under 35 U.S.C. 154(b) by 0 days.

(21) Appl. No.: 09/574,583

(22) Filed: May 17, 2000

(51) Int. Cl.[7] .................. G08C 1/06; G06F 12/14; H04L 9/32
(52) U.S. Cl. .................................. 713/57; 713/190
(58) Field of Search ............... 713/190, 340; 380/38, 264, 57

(56) References Cited

U.S. PATENT DOCUMENTS

| | | | | |
|---|---|---|---|---|
| 2,981,794 A | * | 4/1961 | Cuvelien .................. | 380/27 |
| 4,064,558 A | * | 12/1977 | Hughes et al. ............ | 711/207 |
| 4,120,030 A | * | 10/1978 | Johnstone ................. | 713/190 |
| 5,892,826 A | * | 4/1999 | Brown et al. ............. | 713/190 |
| 6,463,538 B1 | * | 10/2002 | Elteto ...................... | 713/190 |

FOREIGN PATENT DOCUMENTS

JP 2001265658 A * 9/2001 .......... G06F/12/14

* cited by examiner

*Primary Examiner*—Gregory Morse
*Assistant Examiner*—Jacob Lipman
(74) *Attorney, Agent, or Firm*—Pro-Techtor International Services

(57) ABSTRACT

This invention generally relates to a method and apparatus for securing data contents stored in a non-volatile memory. More specifically, data contents to be stored a flash memory are first partitioned into block based data and rotated such that the addresses are scrambled. During a read operation, a random sequence generated through a random number generator causes contents of the retrieved data to also include original and extra (dummy) data. Through filtering and reverse rotation, original data contents are recovered. Accordingly, data contents in the flash memory are protected against unauthorized access, revision, or modification.

8 Claims, 5 Drawing Sheets

METHOD AND APPARATUS FOR SECURING DATA CONTENTS OF A NON-VOLATILE MEMORY DEVICE

BACKGROUND OF THE INVENTION

1. Field of the Invention

The present invention generally relates to a method and apparatus for securing data contents stored in a non-volatile memory. More specifically, the present invention relates to a method and apparatus for preventing the unauthorized alteration, revision, or access of data contents stored in a flash memory by way of address and data scrambling such that unrecovered data are useless.

2. Description of the Related Art

As shown in FIG. 1, a micro controller unit (MCU) is a key component in a computer structure, which includes a flash memory 10 for storing executable programs. The current encryption and decryption systems do not offer any protection for data contents stored in the flash memory 10. Therefore, a person familiar with encryption and decryption techniques can easily read and access data stored in the flash memory 10. For instance, an executable program containing information such as a user's password or identification can easily be accessed and published when stored in the flash memory 10. In addition, a person using special software (e.g., SOFT IN CIRCUIT EMULATOR or SOFT ICE) can easily alter a computer program as to access information stored in the flash memory 10 without having to know a user's password, thereby stealing information and breaching security.

As an example, cellular phone companies generally incorporate important confidential and proprietary data regarding functions and capabilities of various cellular phones into executable programs using DSP. However, these important data cannot be safely protected against unauthorized access when stored in the flash memory. Accordingly, the flash memory is no doubt a serious security risk with respect to the protection of important data.

One way to solve the above-discussed problems is illustrated in FIG. 2, which combines an MCU and flash memory into an integrated circuit (IC) 20. In this way, the flash memory can only be accessed internally through a build-in data bus as to prevent decoding and unauthorized access and revision. However, this is not an ideal way to solve the above-discussed problems because manufacturing costs are significantly increased due in part to the fact that the flash memory and MCU are manufactured by different processes.

As such, the present invention takes advantage of the fact that reading and writing of the flash memory generally occurs during program loading or machine boot-up, which occurs infrequently. Therefore, through minimal logic and special designs, the present invention is able to protect the contents of data stored in the flash memory.

As previously described, the purpose of this invention is to provide a method and apparatus for securing data contents stored in a non-volatile memory. In particular, the executable programs are sized and processed as block based data, and through scrambling and random accessing, the order and position of the data contents are changed and a new combination is formed. Since the original data contents cannot be recovered without reversing the original process, the data contents in a flash memory are protected without incurring high manufacturing costs.

BRIEF DESCRIPTION OF THE DRAWINGS

The present invention will be more clearly understood from the following description of architecture design and algorithm with the accompanying drawings, where.

DESCRIPTION OF THE PREFERRED EMBODIMENTS

Figure 1:
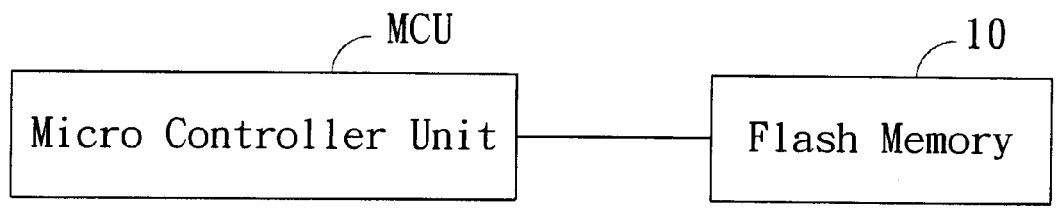
FIG. 1 is a block diagram of a computer system according to a first embodiment of the present invention.
Figure 2:
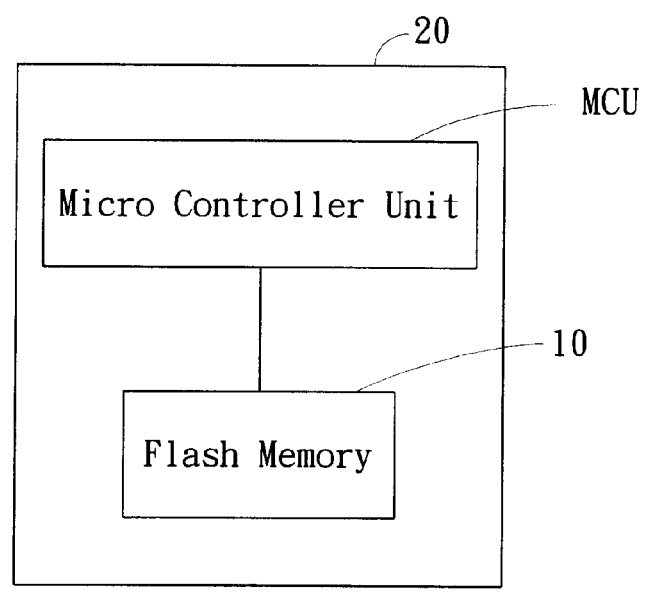
FIG. 2 is a block diagram showing an MCU and flash memory in an IC.
Figure 3:
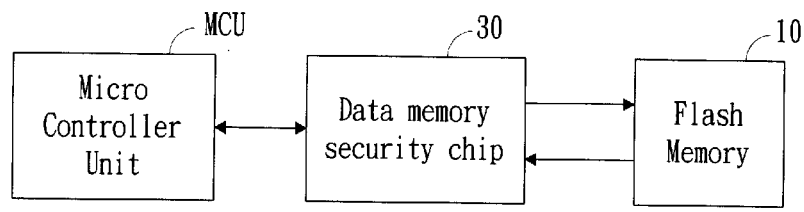
FIG. 3 is a system structure diagram of the present invention.
Figure 4:
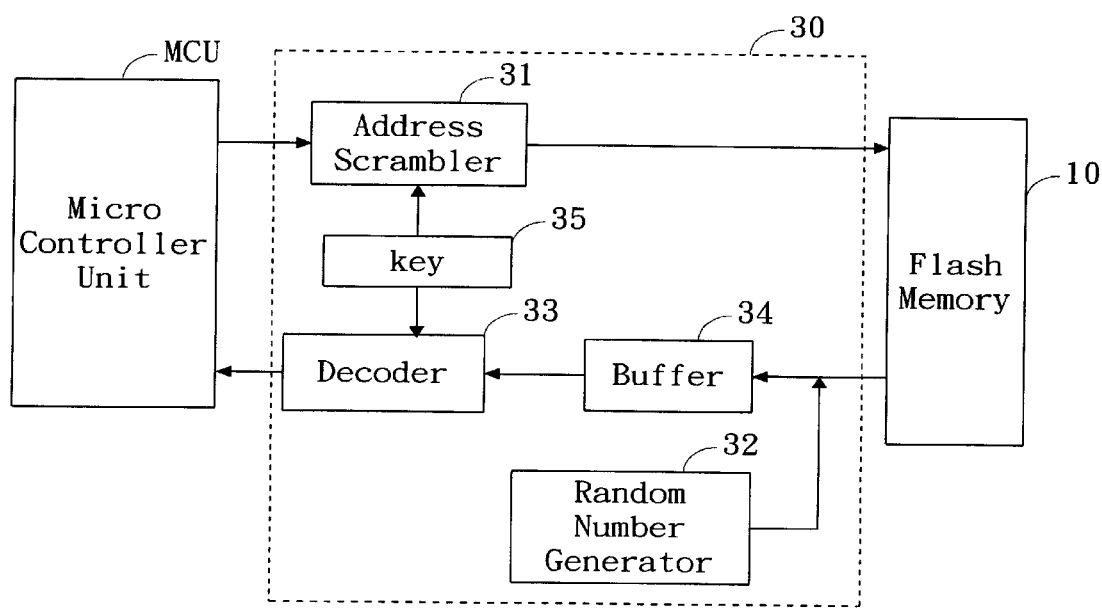
FIG. 4 is a detailed diagram of the memory microchip of FIG. 3.

Numerals used in the figures are explained below.
10 flash memory
20 IC
30 the data memory security chip
31 the address scrambling generator
32 the random number generator
33 the decoder
34 the buffer
35 the key
40 the microchip
41 the register
42 the PROM
43 the random number generator As shown in the FIG. 3, in order to read and write data from and to a flash memory 10 based on an instruction from the MCU, a data memory security chip 30 is used to process and recover data therein. More specifically, FIG. 4 shows the internal structure of the data memory security chip 30, which includes: (1) an address scrambler 31 which rotates block based program and generates a new address for storing and writing data to the flash memory based on the new address; (2) the random number generator 32 for generating a random sequence which is used as the basis for reading data from the flash memory; and (3) a decoder 33 for filtering data read in accordance with the random sequence, and to reverse the block based program such that the original data can be retrieved and executed by the MCU.

The write and read operations directed from the MCU to the flash memory is explained below.

[Write Operation]—can be Considered as Data Encoding:

Through software, an executable program is converted into a block based program of 8×8 bits and rotated. The rotated block based program, which is stored in the original address, are then allocated to the new address generated by the address scrambler 31. For simplicity, a block based program of 4×4 bits is used below for illustration.

Figure 5:
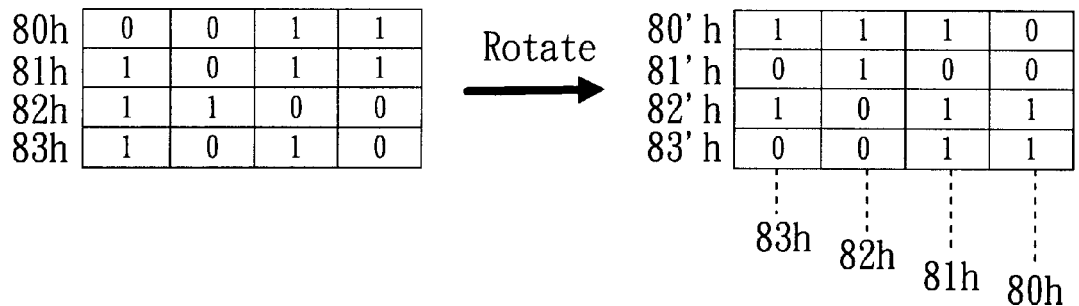
FIG. 5 is a table diagram illustrating the rotation operation.

In FIG. 5, the table at the left-hand side contains the original data. In particular, data 0011 is in address 80h; data 1011 is in address 81h, data 1100 is in address 82h, and data 1010 is in address 83h. The table at the right-hand side contains data after the rotation (e.g., rotating 90 degrees to the right) in which data 1110 correspond to new address 80'h; data 0100 correspond to new address 81'h; data 1011 correspond to new address 82'h; and data 0011 correspond to new address 83'h. However, when comparing the two 4×4 bits executable programs, it is evident that the data in, e.g, the last column of the table at the right-hand side correspond to the original data stored in address 80h of the table at the left-hand side. It is evident that the scrambled data at the new address is different from the original data. However, one attempting to illegitimately access the data contents stored in the flash memory would not be aware of the changed data and would therefore obtain scrambled data that are different from the original data.

Figure 6:
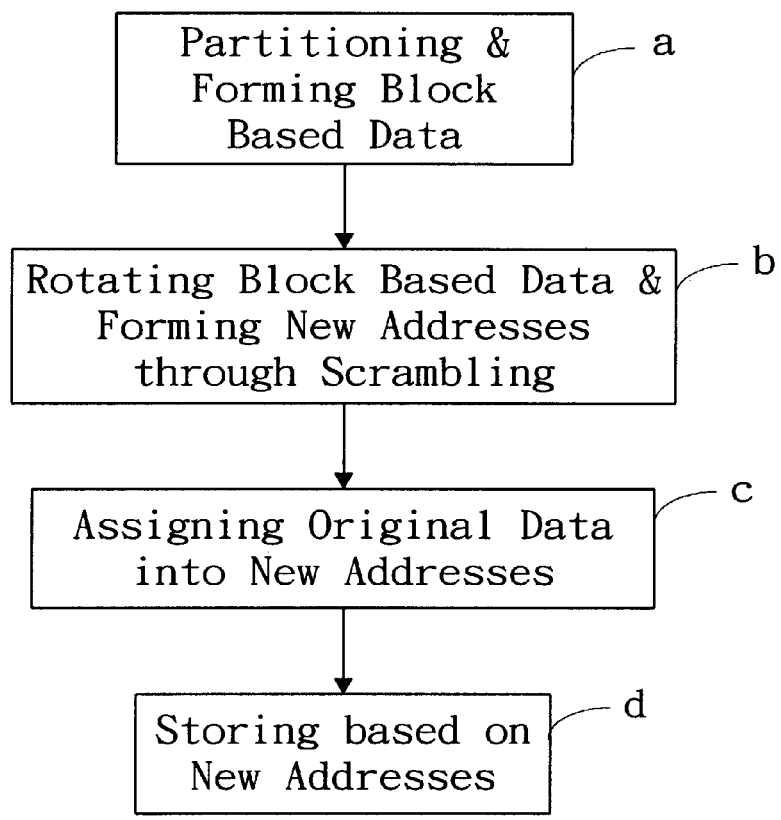
FIG. 6 is a flow chart illustrating the write operation.

The steps in the flow chart of the FIG. 6 are as follows:

step a—partitioning an executable program into block based data;

step b—rotating the block based data to scramble original data addresses and form new data addresses;

step c—assigning new data addresses to the rotated block based data; and step d—storing the rotated block based data, using the new addresses, into the flash memory 10.

[Read Operation]—can be Considered as Data Decoding:

A random number generator 32 is used to generate a random number sequence such that the rotated block based data can be retrieved from the flash memory 10 in accordance with the random sequence and temporarily stored in a buffer (e.g., SRAM). The random sequence space will include the required read address ranges plus some dummy accesses address space. Since the retrieved data contain the original data as well as dummy data, they must be filtered to screen the dummy data. Using a decoder 33, the dummy data and corresponding addresses are cleared. By reversely rotating the filtered data, the original data and addresses can be obtained such that the executable program can be executed by the MCU or DSP. As a result, it would be difficult to decipher the randomly retrieved data, especially with dummy data incorporated therein.

Figure 7:
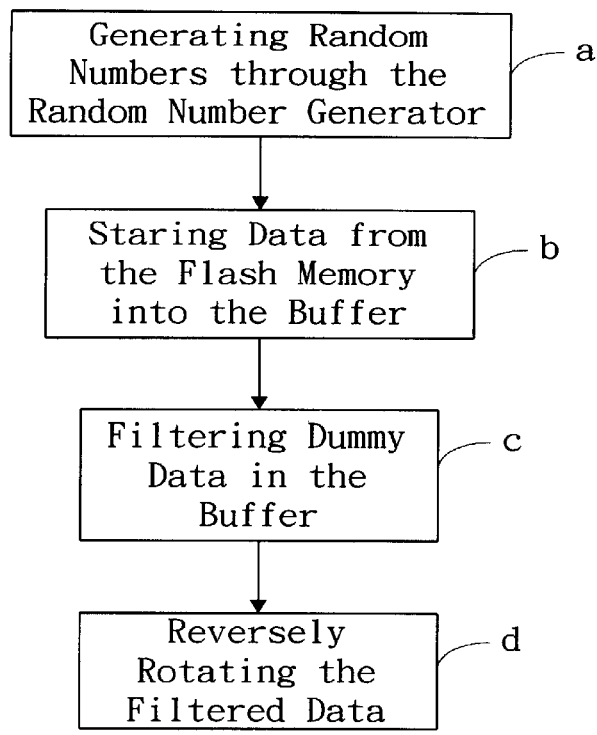
FIG. 7 is a flow chart illustrating the read operation.

The steps in the flow chart of the FIG. 7 are as follows:

step a—generate a sequence of random numbers using a random number generator 32;

step b—retrieve data in the flash memory based on the random number sequence from step a and store the retrieved data into a buffer;

step c—filter retrieved data stored in the buffer 34 to screen dummy data; and step d—reversely rotate the filtered data to uncover the original addresses and recover the original data.

Moreover, in the read operation, a key 35 in the data memory security chip 30 is used to reflect a particular address mapping sequence such that useful data can be distinguished from useless data. The key 35 can be alternatively stored in a smart card.

[Second Embodiment]

Due to linear incrementation of the program addresses, one simple way to prevent unauthorized access is to switch each real address with a random address, thereby forming a series of random addresses in the microchip 40.

Figure 8:
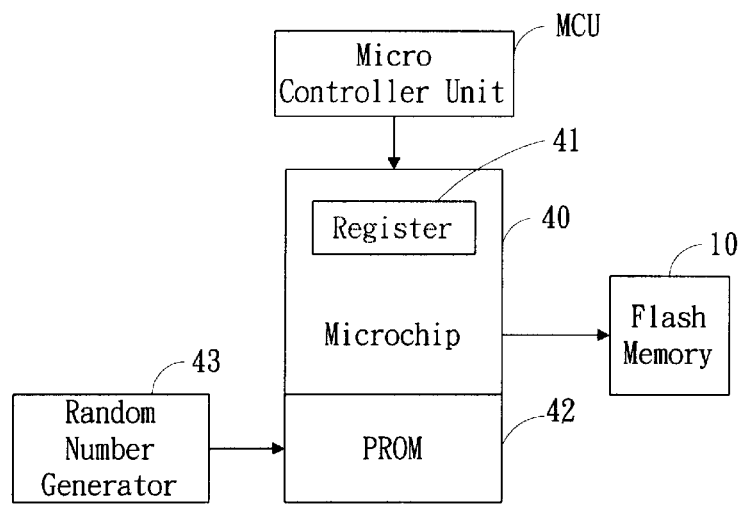
FIG. 8 is a block diagram of a second embodiment of the present invention.

As shown in the FIG. 8, a program from the MCU is stored in the register 41 of the microchip 40 in BYTE units. Within the microchip 40, there is also a programmable read-only memory (PROM) 42 or a small flash memory. As described above, it is difficult and expensive to incorporate a large flash memory 10 into the chip 40. However, it is much simpler to manufacture a small PROM 42. The random codes from the random number generator 43 can be written into the PROM 42 in order to create a conversion table (not shown) for controlling exchanges of the corresponding addresses. The data corresponding to the original addresses are retrieved, rotated, and then stored in the flash memory 10. As a result, data retrieved in an unauthorized manner would be useless, and the flash memory is secured against the unauthorized access or alteration. Additionally, due to the random number generator 43, the converting table in each microchip 40 is different. Accordingly, the original data in the flash memory can be masked in different ways.

Moreover, original addresses can also be complemented prior to switching in order to increases the level of encryption.

Figure 9:
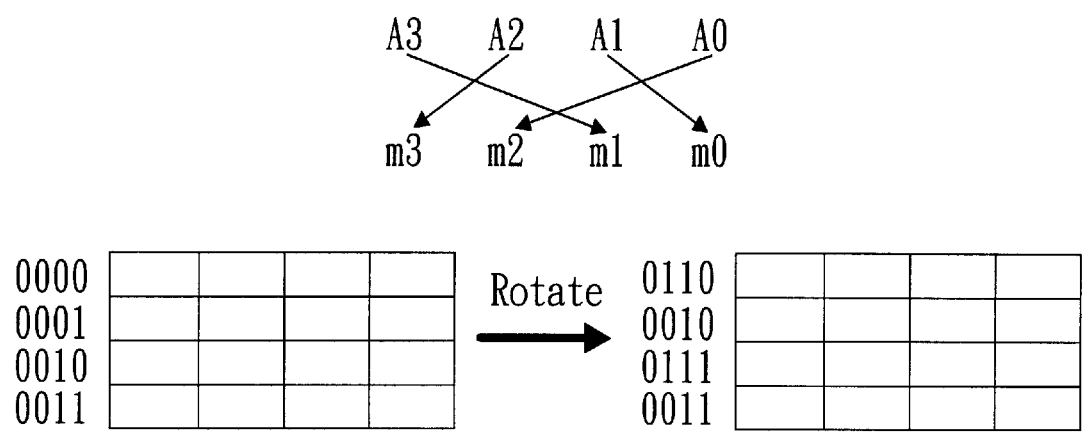
FIG. 9 illustrates the rotation operation in FIG. 8.

An illustration (4×4 bits) is shown in FIG. 9. A3 through A0 are the original addresses, m3 through m0 are the random addresses. The arrow in FIG. 9 indicates the relationship between these two types of address.

A3, A2, A1 and A0 correspond to 0011, 0010, 0001 and 0000, respectively. Using the original addresses for complementary calculations, then m3=A2, m2=A0, m1=A3, m0=A1 such that m3=0110, m2=0010, m1=0111, and m0=0011, which are the new addresses in the flash memory 10. Such operation would further deter unauthorized data access.

During data retrieval, the converting table stored in the PROM 42 is used to recover the original data.

Moreover, even though data stored in the flash memory 10 is read first by a computer after it is first turned on, data is read sequentially thereafter. As such, one way to increase the decryption difficulty is to use the random number generator 43 in the read operation to introduce unnecessary (dummy) data into the retrieved data, thereby causing a false reading as to further deters unauthorized data access.

As described above, this invention provides a method and apparatus for securing data contents stored in a non-volatile memory. Using the concept of address scrambling and random sequence, new combination of data addresses can be formed. As a result, original data cannot be recovered without the recovering method stated above. Indeed, the present invention provides a novel and effective way to solve the prior art problem of data security in the flash memory.

It is intended that the specification and examples be considered as exemplary only. Other embodiments of the present invention will be apparent to those skilled in the art upon consideration of the specification and practice of the present invention disclosed herein, with a true scope of the present invention being indicated by the following claims.

What is claimed is:

1. A method for securing data contents stored in a non-volatile memory, comprising the steps of:
   a) generating a sequence of random numbers;
   b) writing data to be partitioned into original block based data, said data being rotated and assigned new data addresses in said non-volatile memory, said new data addresses being based on said sequence of random numbers;
   c) creating and writing dummy data to be partitioned into original block based dummy data, said dummy data being assigned data addresses in said non-volatile memory, said data addresses being based on said sequence of random numbers; and
   d) retrieving original and dummy data in said non-volatile memory;
   e) filtering said dummy data from said original data; and
   f) reverse rotating said original data generator according to said sequence of random numbers.

2. The memory of claim 1, wherein the retrieving step comprises the steps of:
   a) generating a sequence of random numbers using a random number generator;
   b) retrieving data in a flash memory based on said sequence of random numbers and storing the retrieved data into a buffer;

c) filtering said retrieved data stored in said buffer to screen said dummy data; and d) reversely rotating the filtered data as to recover the original block based data.

3. The method of claim 1, wherein the writing step comprises the steps of:

a) partitioning an executable program into block based data;

b) rotating said block based data to scramble original data addresses and form new data addresses;

c) assigning said block based data in said original data addresses into new data addresses; and d) storing said rotated block based data into a flash memory based on said new data addresses.

4. The method of claim 3, wherein the block based data are 8×8 bits.

5. An apparatus for securing data contents stored in a non-volatile memory in the form of a security chip between a micro controller unit (or DSP) and a flash memory, comprising:

an address scrambler for partitioning original block based data, rotating the block based data, and forming new data addresses;

a random number generator for generating a sequence of random numbers that is used as the basis for retrieving data contents from the flash memory; and a decoder for filtering dummy data and recovering original block based data and addresses to be used by the micro controller unit (or DSP) through reverse rotation.

6. The apparatus of claim 5, wherein the security chip includes a single key for reflecting a particular address mapping sequence such that dummy data can be filtered therewith.

7. A method for securing data contents stored in a memory device such as a programmable read-only memory (PROM) or a small capacity flash memory, comprising the steps of:

a) generating a conversion table through random codes from a random number generator for controlling address exchanges;

b) retrieving data corresponding to original addresses of said data;

c) introducing through said random number generator, in a read operation, dummy data into said retrieved data so as to cause a false reading thereof in order to deter unauthorized data access;

d) rotating the retrieved data; and e) storing the rotated data into the memory device.

8. The method of claim 7, wherein said original addresses are complemented prior to the address exchanges.

* * * * *